United States Patent [19]

Yoshida

[11] Patent Number: 4,730,133

[45] Date of Patent: Mar. 8, 1988

[54] DECODER CIRCUIT OF A SEMICONDUCTOR MEMORY DEVICE

[75] Inventor: Masanobu Yoshida, Kawaguchi, Japan

[73] Assignee: Fujitsu Limited, Kanagawa, Japan

[21] Appl. No.: 864,243

[22] Filed: May 19, 1986

[30] Foreign Application Priority Data

May 20, 1985 [JP] Japan ................................ 60-107826

[51] Int. Cl.$^4$ ................. H03K 19/094; H03K 19/096; H03K 19/082
[52] U.S. Cl. .................................... 307/449; 307/452; 307/463; 307/468
[58] Field of Search ................................ 307/448–450, 307/452–453, 463, 468

[56] References Cited

U.S. PATENT DOCUMENTS 3,917,958 11/1978 Hatsukano .......................... 307/450

Primary Examiner—John S. Heyman
Assistant Examiner—M. R. Wambach
Attorney, Agent, or Firm—Armstrong, Nikaido, Marmelstein & Kubovcik

[57] ABSTRACT

A decoder circuit of a semiconductor memory device includes a plurality of logic gates each consisted by a load transistor and drive transistors generating a line selection signal corresponding to input address signals, and a power source control circuit for controlling the power source voltage supplied to the logic gate corresponding to a mode designation signal which is a normal mode signal or an all selection mode signal. According to the present invention, when the all selection mode signal is input to the power source control circuit, the all selection mode state of the decoder circuit is obtained by pulling down the power source voltage supplied to the logic gate.

4 Claims, 5 Drawing Figures

DECODER CIRCUIT OF A SEMICONDUCTOR MEMORY DEVICE

BACKGROUND OF THE INVENTION

1. Field of the Invention

The present invention relates to a decoder circuit of semiconductor memory device, more particularly, it relates to a decoder circuit having a simplified circuit arrangement enabling an all selection mode of word lines or bit lines.

2. Description of the Related Art

As is well-known, a decoder circuit is used for selecting the word line or bit line in a semiconductor memory device. In the normal selection mode, a row decoder circuit selects the word line and a column decoder selects the bit line. The all selection mode of word lines or bit lines is used for testing the semiconductor memory device. Accordingly, it is necessary to provide means for generating this mode in the decoder circuit.

Problems have arisen, however, regarding the generating means for the all selection mode in the decoder circuit. That is, this generating means becomes a hindrance to the compacting of space and the reduction of power consumption.

SUMMARY OF THE INVENTION

The object of the present invention is to provide a decoder circuit of a semiconductor memory device having a simplified circuit arrangement enabling an all selection mode of word lines or bit lines. The all selection mode is a mode in which the output of the decoder is set to a high level so that all the word lines or bit lines are set to a high level to test the memory device.

In accordance with the present invention, there is provided a decoder circuit of a semiconductor memory device comprising; a plurality of logic gates each having a load transistor and drive transistors generating a line selection signal corresponding to input address signals, and a power source control circuit for controlling a power source voltage supplied to the logic gate corresponding to a mode designation signal, the mode designation signal being a normal mode signal or an all selection mode signal, wherein when the all selection mode signal is input to the power source control circuit, an all selection mode state of the decoder circuit is obtained by pulling down the power source voltage supplied to the logic gate.

DESCRIPTION OF THE PREFERRED EMBODIMENTS

Before describing the preferred embodiments, an explanation will be given of a conventional decoder circuit having a generating circuit for the all selection mode.

Figure 1:
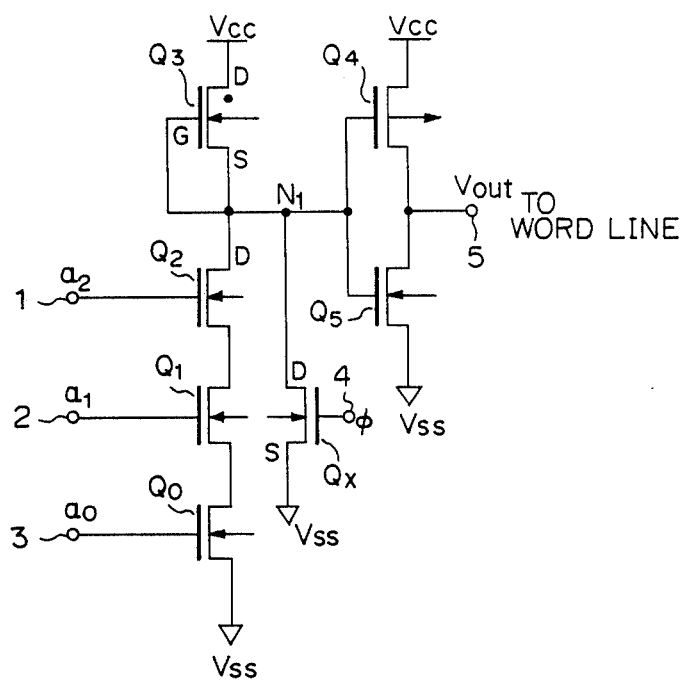
FIG. 1 is a circuit diagram of a conventional decoder circuit.

Referring to FIG. 1, $Q_0$ to $Q_2$ represent N channel enhancement type MOS (NMOS) transistors. $Q_3$ is a load transistor by an N channel depletion type (indicated by a dot) MOS transistor. Transistors $Q_0$ to $Q_3$ constitute a "NAND" gate. $Q_4$ is a P channel enhancement type MOS (PMOS) transistor. A CMOS inverter is constituted by a PMOS transistor $Q_4$ and NMOS transistor $Q_5$. An NMOS transistor $Q_x$ constitutes a generating circuit for the all selection mode. The circuit shown in FIG. 1 shows a row decoder circuit per one word line. That is, this circuit is provided to every word line connected to the output terminal 5. The terminals 1 to 3 represent row address input terminals. In these terminals, the eight kinds of signals ($a_2$, $a_1$, $a_0$) to ($\bar{a}_2$, $\bar{a}_1$, $\bar{a}_0$) are input to each row decoder circuit. In the NMOS depletion type transistor $Q_3$, the drain side (D) is connected to the first power source $V_{CC}$, and the source side (S) and gate (G) are connected in common to the node $N_1$. The node $N_1$ is also connected to the drain (D) of the transistor $Q_2$ and both gates of the transistors $Q_4$ and $Q_5$. Moreover, the node $N_1$ is connected to the drain (D) of the transistor $Q_x$. The source (S) of the transistor $Q_x$ is connected to the second power source $V_{SS}$. The gate of the transistor $Q_x$ is connected to the input terminal 4, to which a mode designation signal (control signal) $\phi$ is input.

When the control signal $\phi$ is a low level "L", the NMOS transistor $Q_x$ is turned OFF. Accordingly, no influence of the transistor $Q_x$ is applied to the potential of the node $N_1$. That is, this circuit functions as a normal decoder circuit. When the control signal is high level "H", the transistor $Q_x$ is turned ON. In this case, the potential of the node $N_1$ becomes "L" level. Since the gates of the transistor $Q_4$ and $Q_5$ are "L" level, the output $V_{out}$ becomes "H" level. Accordingly, since the control signal $\phi$ is applied simultaneously in parallel to the transistor $Q_x$ of another decoder circuit, all word lines can be set to "H" level as the all selection mode.

However, as shown in the circuit diagram, the transistor $Q_x$ as the generating circuit must be provided to every decoder circuit in order to obtain the all selection mode. To provide this circuit for every decoder circuit becomes a hindrance to the compacting of space and a reduction of power consumption.

A decoder circuit according to an embodiment of the present invention will be explained in detail hereinafter.

Figure 2:
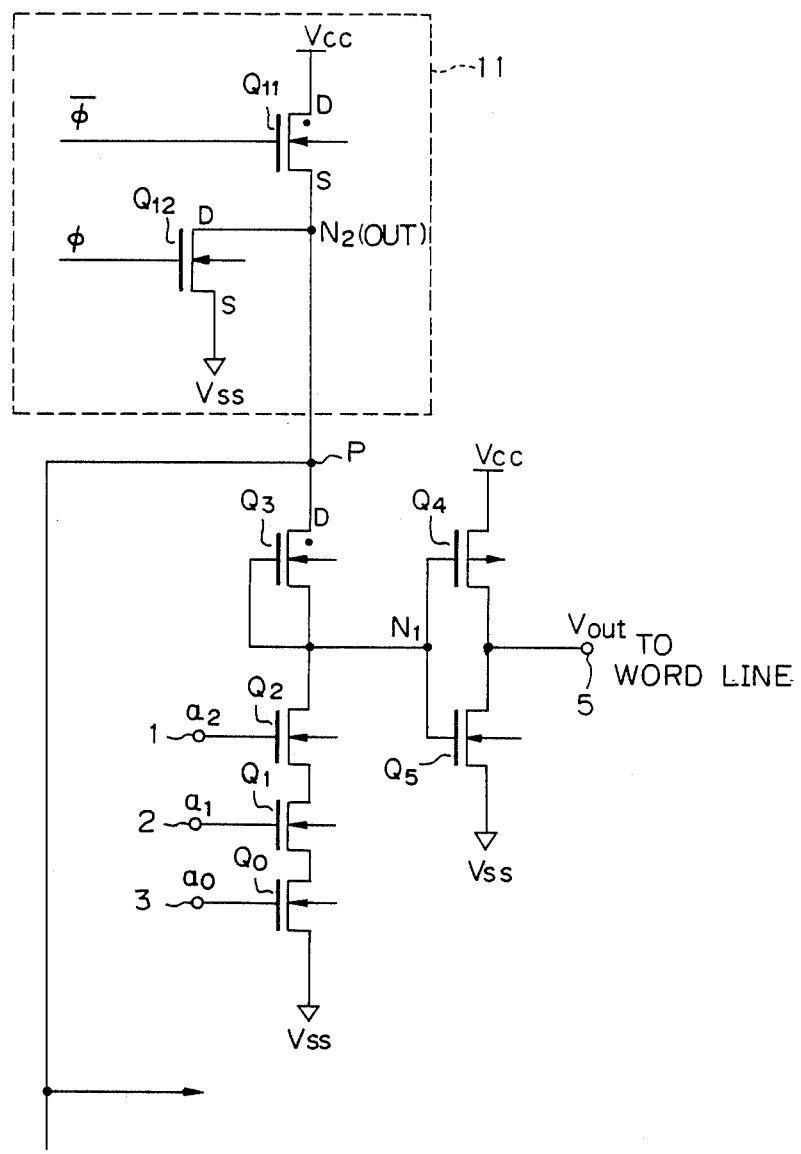
FIG. 2 is a circuit diagram of a decoder circuit according to an embodiment of the present invention.
Figure 3:
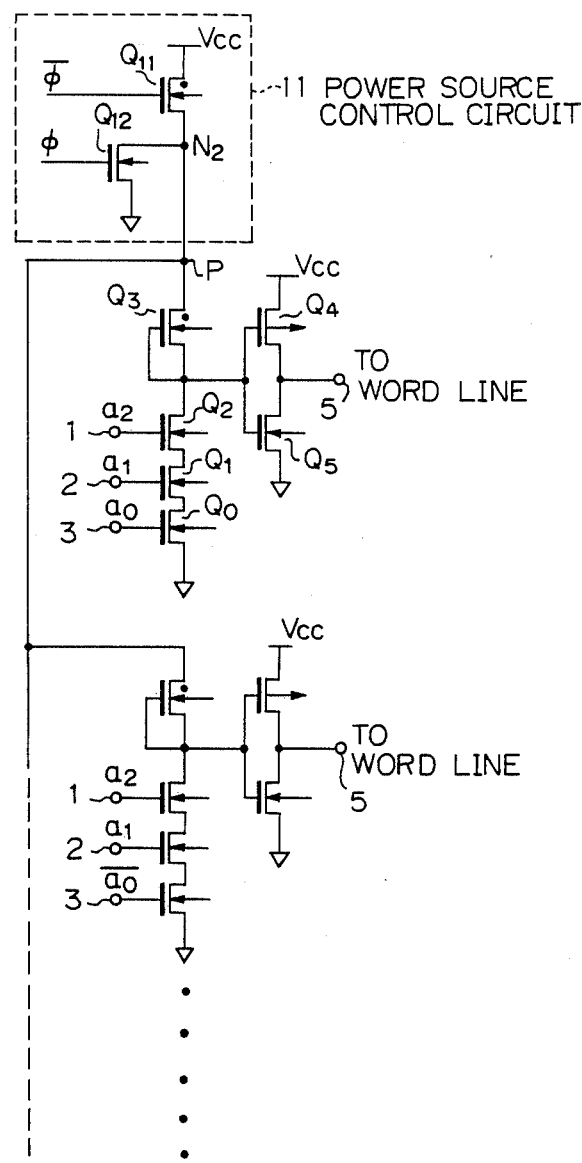
FIG. 3 is a detailed circuit diagram of a row decoder according to the present invention.

Referring to FIG. 2, reference numeral 11 represents a voltage control circuit functioning as a normal power source and as a generating means for the all selection mode. This circuit is constituted by an N channel depletion type MOS transistor $Q_{11}$ and an N channel enhancement type MOS transistor $Q_{12}$. Only one circuit 11 is provided for all of the row decoders, as shown in FIG. 3.

In this circuit, the NAND gate as a logic gate $Q_0$ to $Q_3$ and the CMOS inverter constitute the same circuit as in the conventional device. However, the transistor $Q_x$ is deleted. For example, when all address signals are high (H) level ($a_2$, $a_1$, $a_0$), the potential of the node $N_1$ becomes low (L) level as the line selection signal, because this decoder circuit is constituted by the NAND gate. Accordingly, this decoder is set to the selection state. In this case, the PMOS transistor $Q_4$ is turned ON and the NMOS transistor $Q_5$ is turned OFF since the input node $N_1$ is "L" level. Accordingly, the potential $V_{out}$ of the terminal 5 becomes "H" level.

In the voltage control circuit 11, the drain (D) of the transistor $Q_{11}$ is connected to the first power source Vcc and the source (S) of the transistor $Q_{11}$ is connected to the drain (D) of the transistor $Q_{12}$ and the output node $N_2$. The source (S) of the transistor $Q_{12}$ is connected to the second power source Vss.

In the normal mode, the "L" level control signal as a normal mode signal is input to the gate of the transistor $Q_{12}$ so that the transistor $Q_{12}$ is turned OFF. Simultaneously, the inverted control signal $\bar{\phi}$ is input to the gate of the transistor $Q_{11}$ so that the transistor $Q_{11}$ is turned ON. Accordingly, the power source voltage appears at the output node $N_2$. This power source voltage is used as the power source of the NAND gate.

In the all selection mode, since the control signal $\phi$ as the mode designation signal is "H" level, the transistor $Q_{12}$ is turned ON, and the transistor $Q_{11}$ is turned OFF since the inverted control signal $\bar{\phi}$ is "L" level.

Accordingly, the potential of the output node $N_2$ becomes approximately "0" volt. In this case, the potential of the node $N_1$ also becomes "L" level because the load transistor $Q_3$ is the depletion type transistor which functions as a resistance even when the gate-source voltage is "0" volt.

When the potential of the node $N_1$ becomes "L", the output $V_{out}$ becomes "H" level as the selection mode. Since all decoder circuits are connected to the voltage control circuit 11 in common at the point P, the all selection mode is obtained for all word lines.

Referring to FIG. 3, each of eight kinds of input address signals ($a_2$, $a_1$, $a_0$), ($a_2$, $a_1$, $\bar{a_0}$), ($a_2$, $\bar{a_1}$, $a_0$), ($\bar{a_2}$, $a_1$, $a_0$), ($a_2$, $\bar{a_1}$, $\bar{a_0}$), ($\bar{a_2}$, $\bar{a_1}$, $a_0$), ($\bar{a_2}$, $a_1$, $\bar{a_0}$), and ($\bar{a_2}$, $\bar{a_1}$, $\bar{a_0}$) is input to the corresponding decoder circuit, and the selected word line is then driven to become "H" level in the normal mode. In the all selection mode, all word lines become "H" level as mentioned above.

Figure 4:
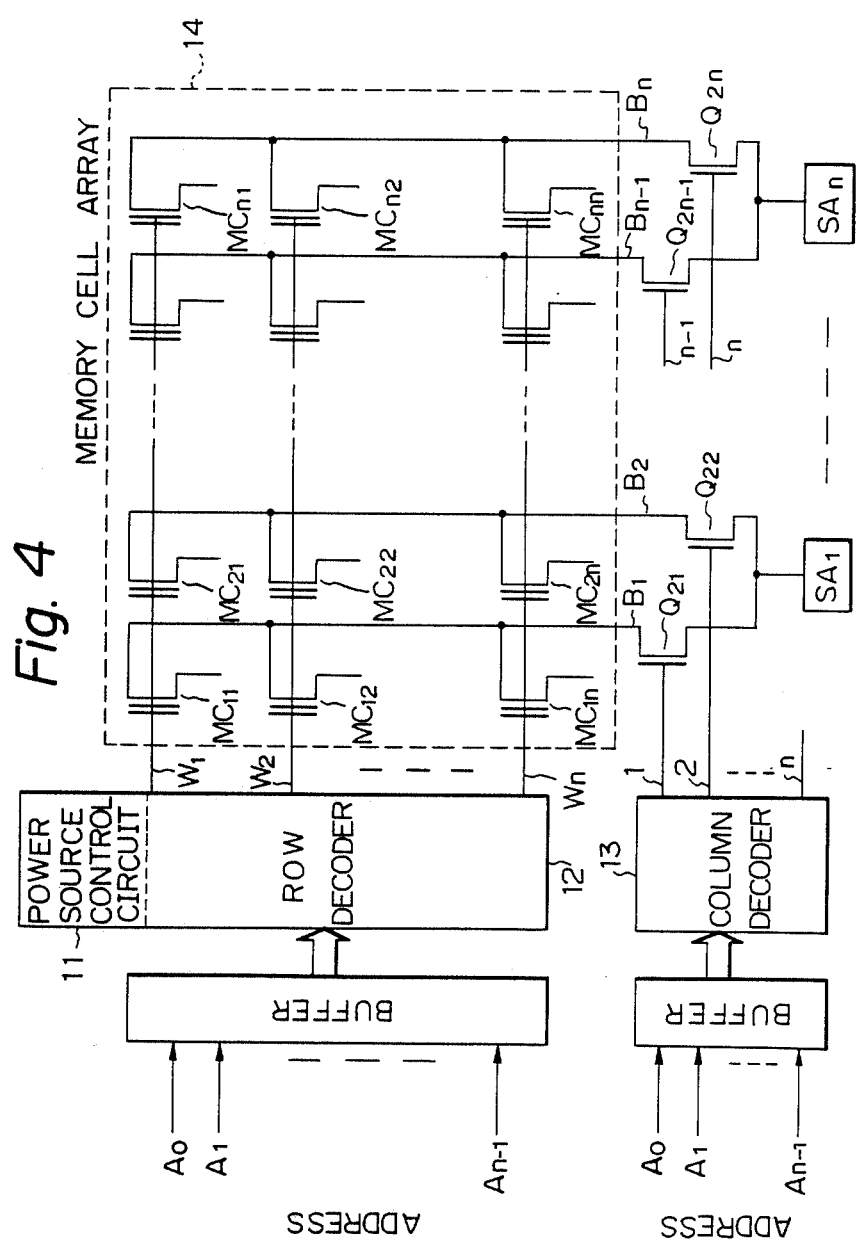
FIG. 4 is a schematic block diagram of a semiconductor memory device according to the present invention.

Referring to FIG. 4, row address signals $A_0$ to $A_{n-1}$ are input to the row decoder 12 through the buffer. As mentioned above, only one power source control circuit 11 is provided at the external portion of the row decoder 12. Therefore, it is possible to compact the circuit arrangement of the row decoder 12. Each of the word lines $W_1$ to $W_n$ is connected to the row decoder 12 (output terminal 5 shown in FIGS. 2,3). Reference numeral 14 is a memory cell array constituted by a plurality of memory cells $MC_{11}$ to $MC_{nn}$, each of which is an EPROM. Column address signals $A_0$ to $A_{n-1}$ are input to the column decoder 13. Each of the bit lines $B_1$ to $B_n$ is connected to the column decoder 13 through each of the transistors $Q_{21}$ to $Q_{2n}$, and each of the sense amplifiers $SA_1$ to $SA_n$ is provided to each pair of bit lines. In this embodiment, although the power source control circuit 11 for the all selection mode is provided at the row decoder side in order to make all word lines to the selection mode, it is possible to provide this control circuit 11 at the column decoder side in order to make all bit lines to the selection mode. In this case, as in the first embodiment, only one power source control circuit 11 is provided at the external portion of the column decoder 13 (not shown).

Figure 5:
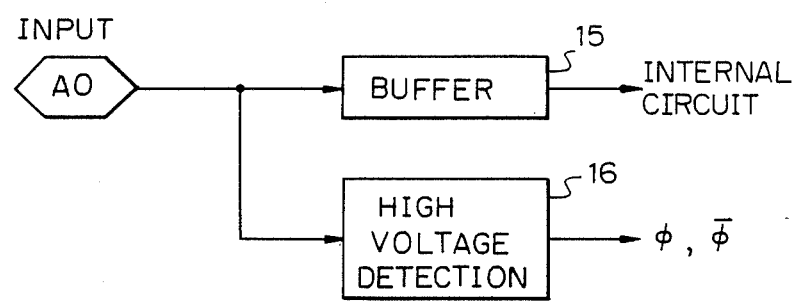
FIG. 5 is a schematic block diagram of a control signal generating means.

Referring to FIG. 5, the control signal $\phi$ and inverted control signal $\bar{\phi}$ are obtained by the high voltage detection circuit 16. This control signal is set to approximately a voltage twice as high as that of the normal input TTL level. In the normal mode, the TTL level voltage (about 5 volts) is input to the address terminal AO. In this case, this TTL level signal is input to the input buffer 15 as in a normal operation. In the all selection mode, the high level signal (about 10 volts) is input to the terminal AO. This voltage is detected by the high voltage detection circuit 16 so that the control signal $\phi$ having high voltage is obtained and, in this case, the inverted control signal $\bar{\phi}$ becomes the "L" level of the TTL level.

As is obvious from the above explanation, in the present invention, since it is not necessary to provide the transistor for the all selection mode of every decoder circuit, it is possible to considerably compact the circuit arrangement. Moreover, since only two transistors are provided for the all selection mode, the number of transistors can be reduced so that the power consumption can be considerably reduced in the all selection mode.

I claim:

1. A decoder circuit of a semiconductor memory device including a plurality of memory lines comprising;

a plurality of logic gates, each logic gate including a load transistor and drive transistors for generating a line selection signal for selecting a specific memory line of said plurality of memory lines corresponding to input address signals applied thereto, and a power source control circuit connected to said logic gates and for controlling, in common, power source voltage supplied to each of said logic gates in response to a mode designation signal, said mode designation signal being a normal mode signal and an all selection mode signal, wherein when said all selection mode signal is input to said power source control circuit, an all selection mode state of said decoder circuit is obtained by pulling down said power source voltage supplied to each of said logic gates.

2. A decoder circuit as claimed in claim 1, wherein said power source control circuit comprises an N channel depletion type MOS transistor and an N channel enhancement type MOS transistor.

3. A decoder circuit as claimed in claim 1, wherein each of said logic gates includes a load transistor connected between said power source control circuit and said logic gate and comprising an N channel depletion type MOS transistor.

4. A decoder circuit as claimed in claim 1, wherein each of said logic gates comprises a plurality of N channel enhancement type MOS transistors.

* * * * *